June 10, 1969 R. MULLER 3,449,645

UNIPOLAR TRANSISTOR FOR HIGH FREQUENCIES

Filed May 3, 1966

United States Patent Office 3,449,645

Patented June 10, 1969

3,449,645
UNIPOLAR TRANSISTOR FOR HIGH FREQUENCIES

Rudolf Muller, Strasslach, Germany, assignor to Siemens Aktiengesellschaft, Erlangen, Germany, a corporation of Germany Filed May 3, 1966, Ser. No. 547,349
Claims priority, application Germany, May 5, 1965, S 96,950
Int. Cl. H01l *11/04, 11/10*
U.S. Cl. 317—235 8 Claims

ABSTRACT OF THE DISCLOSURE

A unipolar transistor for high frequencies comprises a crystalline semiconductor body having a source electrode and a drain electrode substantially coplanarly disposed thereon. The semiconductor body has a channel zone for charge carriers in the semiconductor body between the source and drain electrodes. A delay line comprising at least one field effect control electrode is positioned on the channel zone of the semiconductor body between and substantially coplanarly disposed with the source and drain electrodes and has a delay direction which is parallel to the longitudinal direction of the channel zone.

My invention relates to unipolar transistors for high frequencies having a crystalline, particularly monocrystalline semiconductor body with two main (source and drain) electrodes bordering a channel zone for the charge carriers and having at least one field-effect control electrode insulated from the semiconductor body.

In unipolar field-effect transistors with an insulated control electrode the frequency limit is determined by the length of the channel zone, this limit being higher with a smaller channel length. However, raising the frequency limit by shortening the channel zone can be applied to a moderate extent only, because such shortening reduces the controllability and hence the amplifying gain of the field-effect transistor.

It is an object of my invention to overcome such shortcomings and to render unipolar transistors of this general type suitable for amplifying operation at much higher frequencies.

To this end, and according to my invention, I take advantage of travel-time effects generally similar to those known from the technique of electronic tubes for extremely high frequencies. To make this possible, and in accordance with further features of my invention, I design unipolar transistors as set forth presently.

In the crystalline semiconductor body of a unipolar transistor a channel zone for the charge carriers is longitudinally limited by two main electrodes forming a source and a drain respectively, and at least one field-effect control electrode is provided in insulated relation to the semiconductor crystal. To make such transistor suitable for high frequencies, and in accordance with the invention, I replace the usual control electrodes by delay lines whose direction of delay is oriented in parallel relation to the longitudinal direction of the channel zone. According to another, preferred feature of the invention, the delay-line electrode is preferably designed as an interdigital line. This permits modulating the current-conducting channel by a progressing wave. By suitably dimensioning the modulation substantially for synchronism, namely when the phase velocity of the wave to be amplified is equal to, or smaller than, the drift velocity of the charge carriers in the channel zone, this modulation of the channel generates influence currents in the delay line which are so directed as to amplify the wave travelling in the delay line.

The invention will be further described and explained with reference to the accompanying drawing showing schematically several embodiments of unipolar field-effect transistors according to the invention by way of example.

The same reference characters are applied in all of the illustrations for functionally corresponding elements respectively.

Figure 1:
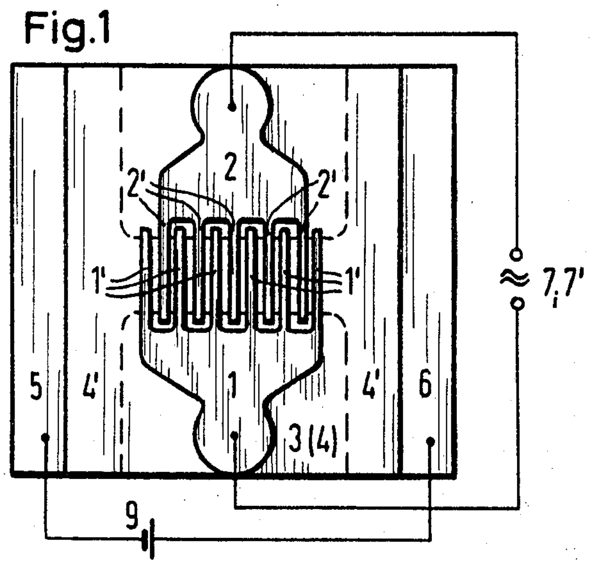
FIG. 1 is a plan view on enlarged scale of a field-effect transistor equipped with an interdigital line to serve as delay-line electrode.

As illustrated in FIG. 1, an interdigital line is formed by two walls 1 and 2 which are extended into a number of parallel tines or fingers 1', 2' of the same length H. These comb-type electrode configurations are deposited upon the insulating oxide coating 3 of the monocrystalline semiconductor wafer 4. The wave propagation in the two-conductor system thus formed is essentially in accordance wtih that known from the technique of electronic tubes. Located at the respective ends of the flat semiconductor wafer 4 are the source electrode 5 and the drain electrode 6 which are electrically connected with each other through a channel of controllable conductivity extending in the crystal beneath the electrode fingers 1', 2'. It will be seen that in lieu of the known insulated control electrode, the illustrated transistor is provided between the source electrode and the drain electrode with the interdigital line of comb fingers so that the effective conductivity of the channel is controlled by the field effect of the comb-type delay line.

Figure 2:
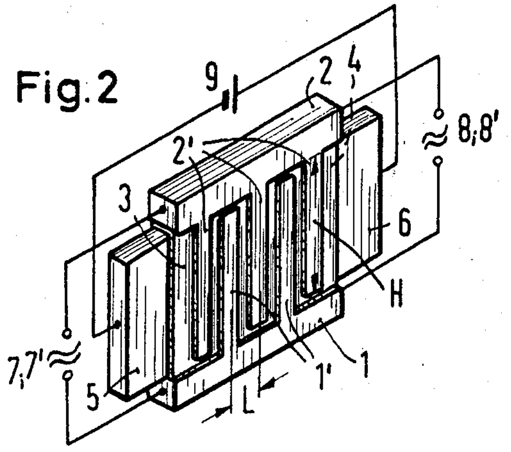
FIG. 2 shows schematically in perspective another embodiment.
Figure 3:
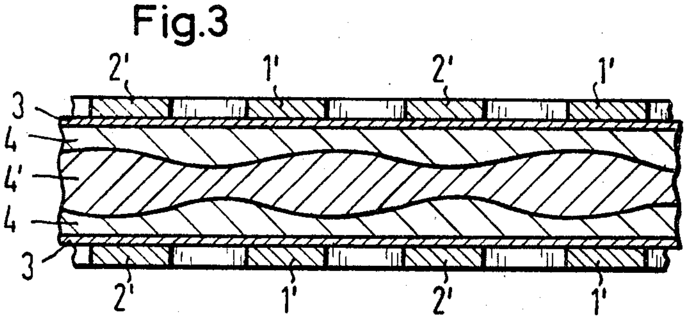
FIG. 3 is a partial cross section through the transistor according to FIG. 2.

By arranging a pair of finger electrodes on each of the two opposite flat sides of the channel, as is the case in the embodiment of FIGS. 2 and 3, the fields produced in the semiconductor crystal are made symmetrical, thus modulating the width and consequently the effective conductivity of the channel 4' within the semiconductor crystal 4. This type of channel-width modulation is schematically represented in FIG. 3. When an operating voltage is impressed between source and drain electrodes and is lower than the pinch-off voltage, the width of the current-conducting channel depends upon the potential obtaining at the control electrodes. As a result of the high-frequency alternating voltage at the delay line, there occurs the channel profile represented in FIG. 3 if the delay line is so designed that symmetrical fields will occur. By applying a drift voltage, the charge carriers are caused to travel from the source to the drain electrode. If the charge-carrier velocity is equal to, or larger than, the phase velocity of the wave on the delay line, the change in space charge of the channel zone produces in the delay line an influenced current which becomes added to the original current wave and thus amplifies the wave.

The wave input coupling is preferably effected by providing each of the two comb-type and mutually straddling control electrodes 1, 1' and 2, 2', between which the high-frequency alternating voltage is to be impressed, with only one current supply conductor each, this being shown in FIG. 1. However, it is in some cases advisable, particularly in devices with a large number of electrode fingers 1' and 2', to couple the high-frequency wave into the circuit at one end of the pair of mutually straddling comb electrodes, and provide a wave output coupling at the opposite end, as is the case in the embodiment of FIG. 2.

In both embodiments a direct-voltage source 9 is connected between the main electrodes 5 and 6. In the transsistor circuit shown in FIG. 1, the high-voltage source is connected at terminals 7, 7' through current supply leads to the respective comb electrodes 1, 2. In the embodiment of FIG. 2, the high-frequency wave is coupled into the system at terminals 7, 7' of current supply leads at the end of the electrodes 1, 2 shown at the left, whereas the amplified high-frequency voltage is coupled out at the opposite end, namely at terminals 8 and 8'.

If the fundamental material of the semiconductor crystal is silicon, the realizable carrier velocity at a drift field strength of about 3000 v./cm. is about $3 \cdot 10^6$ cm./sec. This corresponds to a delay ratio $c/v = 10^4$. For an interdigital line, the delay ratio $c/v$ is proportional to the wave length $\lambda$ and inversely proportional to the spacial period L corresponding to the distance between two comb fingers. If L corresponds to a length of 12 $\mu$m., the frequency $\nu$ of the high-frequency voltage to be amplified is $\nu = 2.5$ gHz.

Obtaining a large amplifying gain requires a large channel length. Due to the voltage drop in the semiconductor crystal, however, the channel becomes constricted with increasing distance from the source electrode. To nevertheless keep the length of the amplifying component sufficiently large, the delay line can be subdivided with respect to direct-current flow at one or more localities, so that respectively different direct-voltage potentials can be applied and the median channel width is adjustable at will. In the case on n-type conductivity in the channel, the D.C. potential of the delay line must become more positive toward the drain electrode.

According to the invention there exists the following other possibility of preventing constriction of the channel.

According to Shockley (Proc. of the I.R.E., 1952, pages 1365–1375), the following relation exists between the value $b$ of one half of the channel width on the one hand and the potential difference W between control electrode and channel on the other hand:

$$W = \left(1 - \frac{b}{a}\right)^2 \cdot \frac{\rho_0 a^2}{2\epsilon}$$

In this equation:

$\rho_0$=density of the space charge due to doping, $2a$=width of the semiconductor between the control electrodes, $\epsilon$=dielectrical constant of the semiconductor.

The channel width is to be so chosen that, on the one hand, the high-frequency mutual effect is sufficient over the entire length of the channel and, on the other hand, the channel will not be constricted. If the channel width $2b$ is to be kept constant, the direct-voltage drop per unit length must be constant. This means, however, that the channel potential W must increase in proportion to the channel length. The foregoing equation shows that, for a constant value $b$, this results in a space charge density which increases approximately linearly in the longitudinal direction of the chanel zone.

It is therefore another object of the invention to achieve a constant channel width. To this end, I provide the crystal with a dopant concentration $\rho_0/e$ which increases approximately linearly from the source to the drain electrode ($e$ denoting the elementary charge). Such graduated doping is obtained, for example when pulling the semiconductor crystal, by slowly adding more dopant, or it can also be obtained by the conventional diffusion process, an approximation to linearity being generally sufficient and satisfactory.

To those skilled in the art it will be apparent from a study of this disclosure that with respect to design and arrangement and material of the transistor components, as well as regards the particular circuitry used, my invention permits of various modifications and may be given embodiments other than particularly illustrated and described herein, without departing from the essential features of the invention and within the scope of the claims annexed hereto.

I claim:

1. Insulated gate field effect transistor for high frequencies, comprising:

a crystalline semiconductor body;

a source electrode on said semiconductor body;

a drain electrode on said semiconductor body, said semiconductor body having a channel zone for charge carriers in said semiconductor body between said source and drain electrodes, said source and drain electrodes being substantially coplanarly disposed; and an interdigital delay line comprising at least one field effect control electrode on the channel zone of said semiconductor body and electrically insulated from said semiconductor body by an oxide layer between said source and drain electrodes, said delay line having a delay direction which is parallel to the longitudinal direction of said channel zone.

2. A transistor according to claim 1, wherein said delay line is an interdigital delay line.

3. A transistor according to claim 2, wherein said interdigital delay line comprises two comb-type electrode members straddling each other and having respective current supply conductor means.

4. A transistor according to claim 3, wherein said conductor means of each electrode member is a single current supply lead.

5. A transistor according to claim 3, wherein the conductor means of each of said two electrode members comprises a pair of conductors for wave-input coupling and wave-output coupling.

6. A transistor according to claim 3, wherein said two comb-type electrode members are arranged on only one side of said channel.

7. A transistor according to claim 3, wherein each two of said mutually straddling comb electrode members are arranged on each of the two sides of said channel.

8. An insulated gate field effect transistor for high frequencies, comprising:

a crystalline semiconductor body;

a source electrode on said semiconductor body;

a drain electrode on said semiconductor body, said semiconductor body having a channel zone for charge carriers in said semiconductor body between said source and drain electrodes, said source and drain electrodes being substantially coplanarly disposed and said channel zone having a dopant concentration which increases almost linearly from said source electrode toward said drain electrode; and a delay line comprising at least one field effect control electrode on the channel zone of said semiconductor body and electrically insulated from said semiconductor body by an oxide layer between said source and drain electrodes, said delay line having a delay direction which is parallel to the longitudinal direction of said channel zone.

References Cited

UNITED STATES PATENTS

| | | | |
|---|---|---|---|
| 2,993,998 | 7/1961 | Lehovec | 317—235 |
| 3,173,102 | 3/1965 | Loewenstern | 317—235 |
| 3,192,398 | 6/1965 | Benedict | 317—235 |
| 3,333,115 | 7/1967 | Kauakami | 317—235 |

JOHN W. HUCKERT, *Primary Examiner.*

J. D. CRAIG, *Assistant Examiner.*

U.S. Cl. X.R.

307—304; 333—30